United States Patent
Willis et al.

(10) Patent No.: US 6,418,056 B1
(45) Date of Patent: Jul. 9, 2002

(54) METHOD AND APPARATUS FOR A VOLTAGE RESPONSIVE RESET FOR EEPROM

(75) Inventors: Scott C Willis, Manassas; Mark J Jones, Centreville, both of VA (US)

(73) Assignee: BAE Systems, Inc., Nashua, NH (US)

( * ) Notice: Subject to any disclaimer, the term of this patent is extended or adjusted under 35 U.S.C. 154(b) by 0 days.

(21) Appl. No.: 09/563,197

(22) Filed: May 2, 2000

Related U.S. Application Data

(60) Provisional application No. 60/137,739, filed on Jun. 2, 1999.

(51) Int. Cl.[7] .............................................. G11C 16/06
(52) U.S. Cl. ..................................... 365/185.2; 365/226
(58) Field of Search ............................. 365/185.2, 226; 327/142

(56) References Cited

U.S. PATENT DOCUMENTS

| | | |
|---|---|---|
| 4,254,347 A | 3/1981 | Ray |
| 4,849,656 A | 7/1989 | Neidorff |
| 5,564,010 A | * 10/1996 | Henry ........................ 714/22 |

OTHER PUBLICATIONS

Hitachi Ltd., HN58C1001 Series, Hitachi, Ltd., Semiconductor & IC Div., Tokyo, Japan, Apr. 8, 1997 (ADE–203–028F(Z)).

LinFinity Microelectronics, Inc., SG1562B/SG2562B/SG3526B Regulating Pulse Width Modulator, LinFinity Microelectronics, Inc., Garden Grove, California, copyright 1994.

Unitrode Integrated Circuits, UC1526 UC2526 UC3526 Regulating Pulse Width Modulator, Jun., 1993.

* cited by examiner

Primary Examiner—A. Zarabian
(74) Attorney, Agent, or Firm—Ronald R. Snider; Snider & Associates

(57) ABSTRACT

An under voltage lockout $\overline{\text{RESET}}$ circuit is connected to the $\overline{\text{RESET}}$ terminal of a EEPROM. The EEPROM is used in a system which may include a computer or processor and which may be used in space. The under voltage lockout $\overline{\text{RESET}}$ circuit maybe an under voltage lockout circuit used on a LinFinity SG1526/B or a Unitrode UC1526 regulating pulse width modulator which maintain the $\overline{\text{RESET}}$ voltage low at all values of power supply voltage source voltage less than a predetermined level. In one embodiment the under voltage lockout $\overline{\text{RESET}}$ circuit output voltage does not have a "floating voltage" which rises to a level higher than its value when a comparator initially senses that a power supply voltage source voltage is less than the predetermined amount. This is a flat $\overline{\text{RESET}}$ characteristic under voltage lockout. The $\overline{\text{RESET}}$ circuit in combination with the EEPROM and computer has particular utility in space applications when a "floating voltage" may be undesirable and may cause failure in a satellite.

9 Claims, 4 Drawing Sheets

POWER SUPPLY
VOLTAGE SOURCE
VOLTAGE

POWER SUPPLY
VOLTAGE SOURCE
VOLTAGE

METHOD AND APPARATUS FOR A VOLTAGE RESPONSIVE RESET FOR EEPROM

CROSS REFERENCE TO PROVISIONAL PATENT APPLICATION

This application claims the benefit of the filing date of U.S. Provisional Patent Application No. 60/137,739 filed Jun. 2, 1999, the disclosure of which is incorporated herein by reference.

This invention was made with government support under A012 which is a Storage Unit under prime contract F33657-88-C-4280. The Government has certain rights in this invention.

BACKGROUND OF THE INVENTION

1. Field of the Invention

This invention relates to a combination of an under voltage lockout $\overline{RESET}$ circuit, an electronically erasable programmable read only memory (here in after EEPROM), and a electrical system which are especially useful in space and satellite applications. In digital circuits it is desirable to hold the logic levels at a known state when power is turned on.

2. The Prior Art

In satellites, electrical systems including computers are used for many tasks such as satellite control, telecommunications relay, detection of terrestrial conditions and detection of non-terrestrial conditions as well as for military purposes. In any task where a EEPROM is used, it is desirable to protect the EEPROM from loss of data, or from unintentional programming. EEPROMs are used to store data for operation of computers. Therefore, it is necessary to ensure that the EEPROM data does not become corrupted.

In the case where the power supply voltage to the EEPROM is falling, the EEPROM is particularly vulnerable to loss of data or unintentional programming. As the reference voltage falls, the read, write, address and data lines from a computer may go unstable, thereby providing erroneous information to the EEPROM. Therefore, it is necessary to detect falling supply voltages and to immediately clamp the $\overline{RESET}$ terminal of the EEPROM to a very low value (at or near ground) in order to prevent loss of data and unintentional programming.

A EEPROM often used for satellite applications is the Hitachi HN58C1001 series EEPROM, which is described in the specification sheet ADE-203-028F(2) Rev.6.0, Apr. 8, 1997 which is incorporated herein by reference. In the Hitachi 58C1001, when the input voltage $V_{cc}$ is turned on or off, noise on the control pins generated by the CPU may act as a trigger and turn the EEPROM to program by mistake. In this EEPROM, unintentional programming is prevented by holding the $\overline{RESET}$ terminal at a low voltage level (e.g., ground ($V_{ss}$)) during a time when the supply voltage is cut off. Hitachi teaches that when the $\overline{RESET}$ terminal is at a low voltage level, the EEPROM cannot be read or programmed. The unprogrammable state is realized by the CPU's maintaining the $\overline{RESET}$ terminal at cut off ($V_{ss}$ at ground level) when the input voltage ($V_{cc}$) is low or off.

To provide a supply voltage responsive $\overline{RESET}$ terminal voltage for a EEPROM, useful in a satellite, it is necessary to provide a radiation tolerant circuit which provides for a rapid reduction of $\overline{RESET}$ voltage to a low level when the power supply voltage source voltage reaches a predetermined level, and for maintaining the $\overline{RESET}$ voltage at a low level at all power supply voltages from 0 to the levels where the $\overline{RESET}$ is switched on and off.

SUMMARY OF THE INVENTION

The specification sheet for the LinFinity SG1526/B, SG2526/B and SG3526/B regulating pulse width modulators dated April 1990 revision 1.1 dated February 1994, copyright 1994, published by LinFinity Microelectronics Inc. 11861 Western Avenue, Garden Grove, Calif., 92841 is hereby incorporated by reference. In this invention, applicant utilizes the SG1526/B because of it's superior temperature range, its power supply voltage source voltage, $\overline{RESET}$ voltage characteristic curve and its radiation tolerant characteristics -which enable it to withstand satellite conditions.

The Unitrode specification sheet is dated June 1993 and describes to a product known as UC1526, UC2526, and UC3526. This specification sheet is incorporated herein by reference. The Unitrode device does not have a flat $\overline{RESET}$ characteristic under voltage lockout which may be desired for satellite applications as the LinFinity SG1526/B, SG2526/B and SG3526/B circuits, otherwise the under voltage lockout, the soft start, and the digital control port schematic logic appear identical. Still further, the Unitrode products may not possess radiation tolerance which is known to be present in the LinFinity SG 1526/B integrated circuit.

In this specification, applicant will refer to power supply voltage source voltage as the reference voltage sensed by the under voltage lockout. In the LinFinity SG1526/B, $V_{in}$ (supply voltage) is connected directly to the power supply voltage source voltage, $V_{in}$ at all times equals power supply voltage source voltage. In Hitachi's description of the HN58C1001, the input voltage is referred to as $V_{cc}$. This voltage is also the same as power supply voltage source voltage which is sensed by the under voltage lockout circuit.

EEPROM's can lose data when power is transitioning and the control lines on the computer are not in a proper state. This condition can lead to failure in a satellite or other space vehicle. When power supply voltage is increasing, the $\overline{RESET}$ line on the EEPROM needs to be held at a low voltage while the power supply voltage source voltage is coming up or increasing. This condition may be met by the power on $\overline{RESET}$ capability of the under voltage lockout portion of the LinFinity SG1526/B and the Unitrode regulating pulse width modulator integrated circuits. A more complicated issue occurs when power drops unexpectedly. Keeping the write line high while a 5 volt power drops is not sufficient to guarantee no data loss. The only certain way to eliminate the issue is to hold the EEPROM $\overline{RESET}$ line at a low voltage when the power is removed. The solution to the problem requires sensing that the power supply voltage source voltage is going low and producing a low-level voltage signal to the $\overline{RESET}$ line of the EEPROM.

This invention uses only a small portion of a LinFinity SG1526/B or a Unitrode UC 1526 regulating pulse width modulator that contains an integrated under voltage lockout $\overline{RESET}$ circuit that works properly at low voltages. The LinFinity SG1526/B is available in space level screening, and is compatible with space radiation environments. By supplying both power to the LinFinity SG1526/B $V_{in}$ pin and the $V_{in}$ pin (which is usually an output), the desired $\overline{RESET}$ characteristics are obtained. The use of the SG1526/B and UC 1526 is possible because the generated $\overline{RESET}$ signal is used to provide a $\overline{RESET}$ signal to the external circuitry, whereas the intended use was for an internal $\overline{RESET}$ signal in the pulse width modulator power convertor application.

The Hitachi HN58C1001 series EEPROM is recognized as a suitable device for use in satellite applications. Applicant has discovered that the LinFinity SG1526/B regulating pulse width modulator integrated circuit is a device which is radiation tolerant, and which includes an under voltage lockout $\overline{\text{RESET}}$ circuit and output terminal which has the flat $\overline{\text{RESET}}$ characteristic which provides improved protection of a EEPROM on a satellite. on the other hand, the Unitrode circuits do not have the flat RESET characteristic under voltage lockout and for this reason may provide less protection to a EEPROM at low power supply voltage source voltage. The SG1526/B provides the necessary reduction of $\overline{\text{RESET}}$ voltage to a low level and holds $\overline{\text{RESET}}$ at the low level when power supply voltage source voltage reaches a predetermined low voltage level. The $\overline{\text{RESET}}$ voltage is maintained at a low voltage level at all times and at all values of power supply voltage source voltage below the turn off/turn on voltage of the SG1526/B under voltage lockout circuit.

Additional objects and advantages of the invention are set forth in the description which follows, and in part will be obvious from the description, or may be learned by practice of the invention. The objects and advantages of the invention may be further realized and obtained by means of the instrumentalities and combinations, particularly pointed out in the claims.

DETAILED DESCRIPTION OF THE PREFERRED EMBODIMENT

Figure 1:
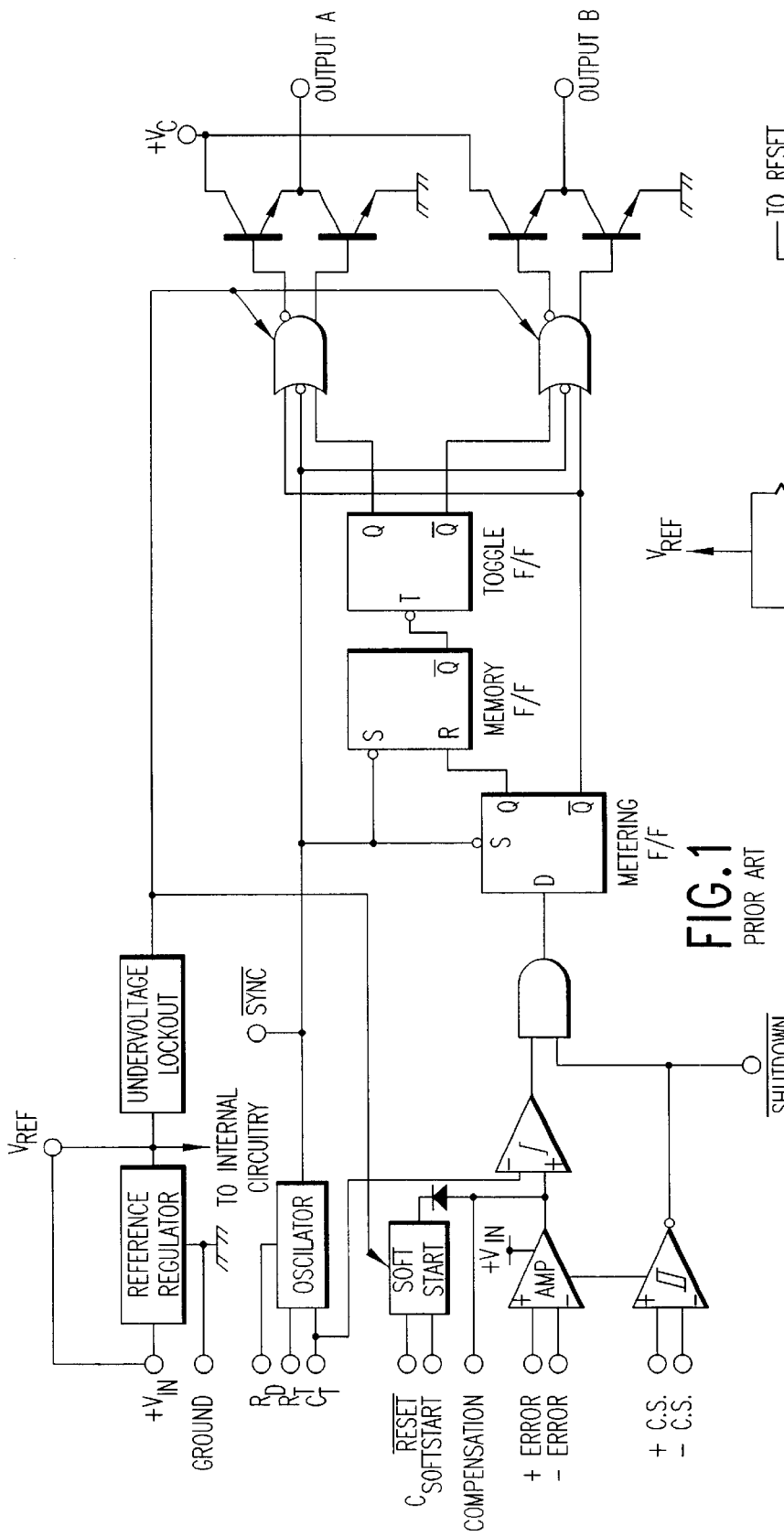
FIG. 1 shows simplified schematic of a prior art regulating pulse width modulator.
Figure 3:
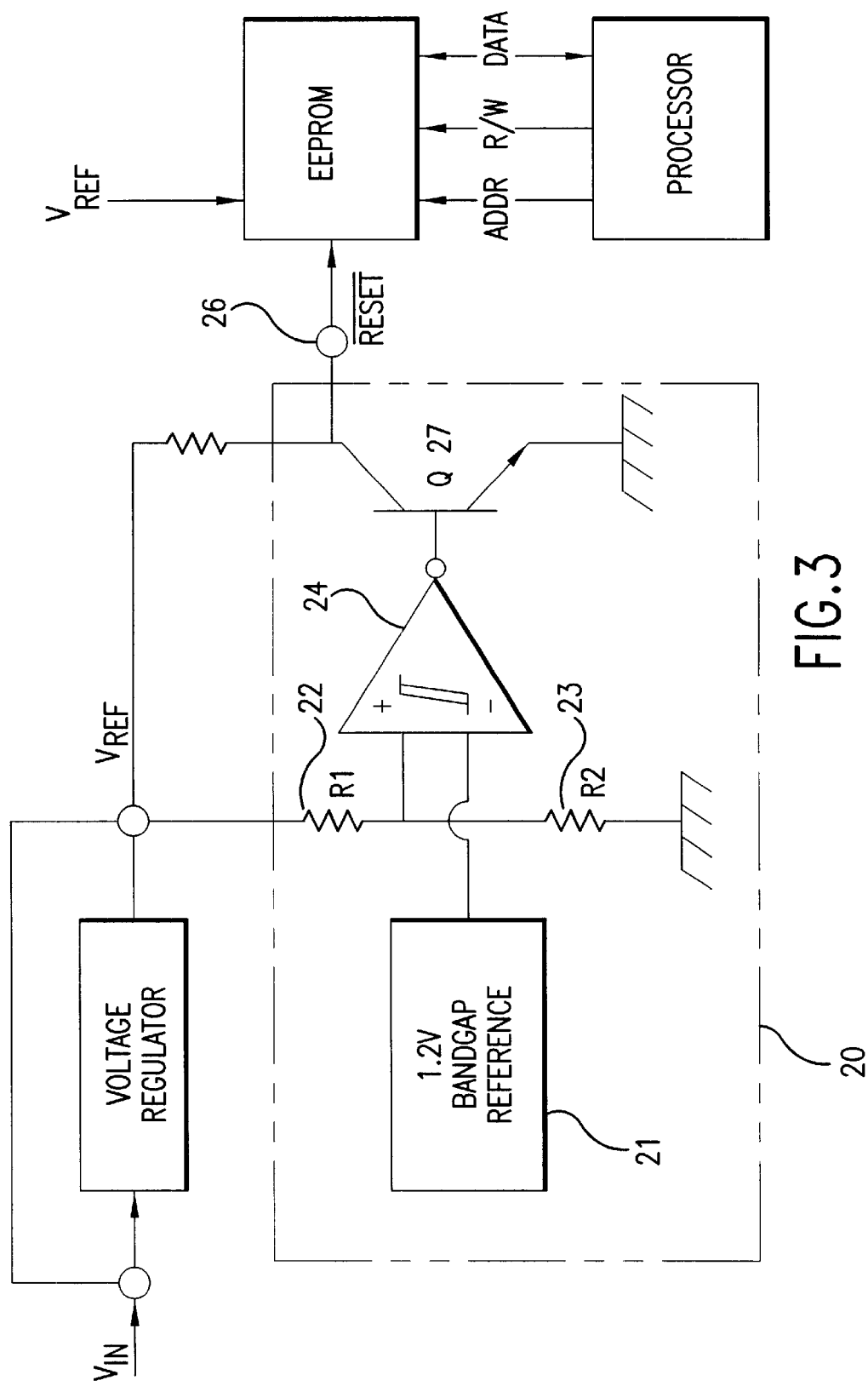
FIG. 3 shows a simplified schematic of the simplified under voltage lockout circuits connected together with a EEPROM and computer.

FIG. 1 shows a simplified block diagram of the LinFinity SG1526/B, SG2526/B or SG3526/B. Applicant utilizes three terminals from the regulating pulse width modulator of FIG. 1 in one embodiment of the invention. These terminals are ground, $\overline{\text{RESET}}$, $V_{ref}$. In the embodiment, the terminal for $V_{ref}$ may be connected to the terminal $V_{in}$ as shown in FIGS. 1 and 3. Upon applying a 5 V signal $V_{in}$ may be tied directly to $V_{ref}$, thereby eliminating the function of the reference regulator shown in FIG. 1 which otherwise would hold the voltage $V_{ref}$ node to 5 volts when $V_{in}$ exceeds 5 volts.

Figure 2:
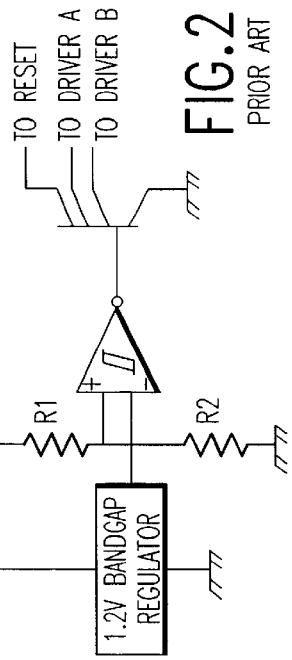
FIG. 2 shows the simplified prior art under voltage lockout circuit schematic.

FIG. 2 shows a simplified equivalent of the LinFinity flat $\overline{\text{RESET}}$ characteristic under voltage lockout circuit and also an equivalent of the Unitrode under voltage lock out circuit.

FIG. 3 is an equivalent circuit of the under voltage lockout circuit, soft start circuit, and digital control port circuit from the LinFinity or Unitrode specification sheets in combination with an EEPROM and an electrical system which may be a digital signal processor or computer. The transistor Q27 shown in FIG. 3 is an equivalent of the transistors Q3 shown in FIG. 22 and again an equivalent of the transistor Q1 shown in FIG. 24 of the LinFinity and Unitrode specification sheets as well as a the transistor in FIG. 2.

In FIG. 3, applicant has set forth a simplified schematic of the entire apparatus of the invention including an SG1526/B under voltage lockout circuit with its component parts shown in FIGS. 1 and 2, the EEPROM and the computer or processor. As shown in FIG. 3, only the portions of FIG. 1, associated with the RESET voltage output are utilized in accordance with this invention. The use of the $\overline{\text{RESET}}$ voltage as an output of the LinFinity SG1526/B or the Unitrode UC 1526 is not the use of the $\overline{\text{RESET}}$ terminal taught in the LinFinity SG1526/B or the Unitrode UC 1526 specification sheets. As shown in FIG. 1, the $\overline{\text{RESET}}$ terminal is connected to a soft start and to the regulating pulse width modulator circuits. The SG1526/B also includes with each digital control port, internal logic. This internal logic has a transistor which can drive an output.

Connecting the $V_{ref}$ pin to the $V_{in}$ pin, as shown in FIGS. 1 and 3 removes the voltage regulator from the circuit. The under voltage lockout circuit 20 (see also FIG. 2) includes a 1.2 volt band gap voltage reference generator 21, a first resistor 22, a second resistor 23, and inverting comparator having a hysteresis characteristic 24, a transistor Q27, and $\overline{\text{RESET}}$ output 26. The band gap voltage reference generator 21 is a reference voltage generator which is compensated for temperature. Band gap references are known in the art as described Horowitz and Hill, *The Art of Electronics*, second edition, 1989, at pages 335–338, which is incorporated herein by reference. The under voltage lockout circuit protects the rest of the pulse width modulator and the power devices it controls from inadequate power supply voltage source voltage. If power supply voltage source voltage is a low voltage, the circuit holds the $\overline{\text{RESET}}$ pin in at a low voltage. This prevents spirous output pulses while the control circuitry is destabilizing. The LinFinity circuit uses a merged band gap reference and comparator circuit which is active when the reference voltage has risen to $2V_{BE}$ or to 1.2 volts at 25 degrees C. The Unitrode UC 1526 also uses a 1.2 volt band gap voltage reference generator. When the LinFinity 1526/B or the Unitrode SG1526 reference voltage rises to approximately 4.4 volts, the circuit releases the $\overline{\text{RESET}}$ pin. The LinFinity 1526/B comparator has 200 mV of hysteresis to minimize oscillation at the trip point. When power supply voltage source voltage to the regulating pulse width modulator integrated circuit is removed and the power supply voltage source voltage drops to 4.2 volts, the under voltage lockout circuit pulls $\overline{\text{RESET}}$ to a low voltage. Voltage $V_a$ in FIG. 4 is the point where power supply voltage source voltage drops to 4.2 volts and $\overline{\text{RESET}}$ goes to a low voltage.

Figure 4:
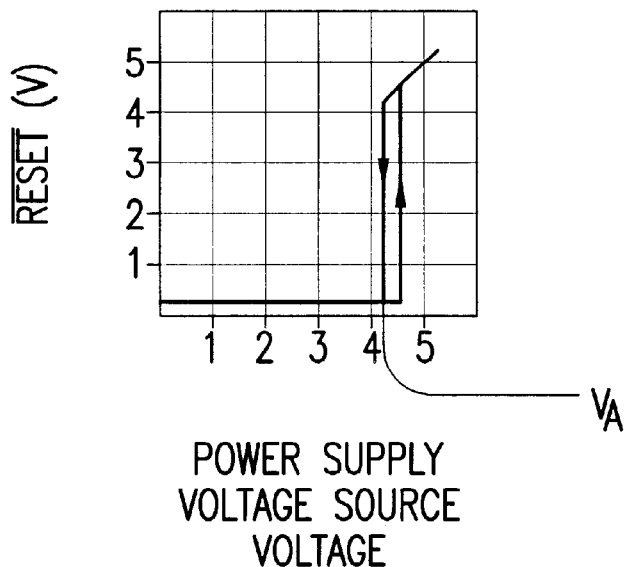
FIG. 4 shows the power supply voltage source voltage plotted against $\overline{\text{RESET}}$ voltage which is the flat $\overline{\text{RESET}}$ characteristic under voltage lockout curve of the LinFinity SG1526/B, SG2526/B and SG3526/B regulating pulse width modulator.
Figure 5:
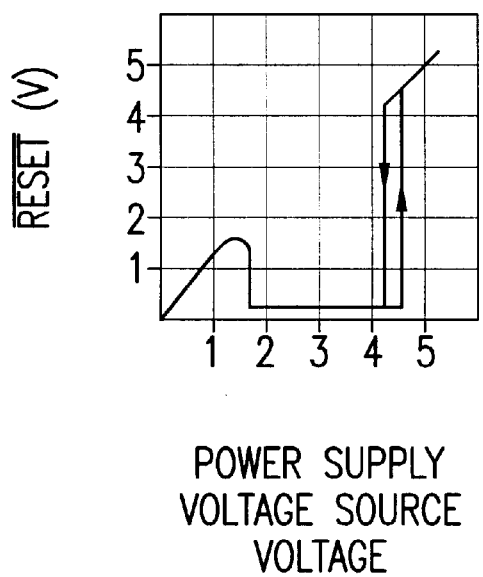
FIG. 5 shows a power supply voltage source voltage, $\overline{\text{RESET}}$ voltage characteristics of the Unitrode SG1526, SG2526 and SG3526 regulating pulse width modulators which demonstrate a $\overline{\text{RESET}}$ voltage rise at low levels of power supply voltage source voltage.

Both FIGS. 4 and 5 demonstrate the hysteresis of approximately 200 mV on the horizontal axis. Hysteresis is the double valued function where different values (4.2 or 4.4 volts) are obtained depending on whether the independent variable ($\overline{\text{RESET}}$ voltage) increases or decreases.

In the SG1526/B and Unitrode UC1526 circuits, there is a separate circuit which provides a soft start function which includes a soft start capacitor. Applicant does not utilize a soft start capacitor in this use of the LinFinity SG1526/B or Unitrode UC 1526 under voltage lockout circuits.

It should be noted that in the power convertor application of the LinFinity SG1526/B and Unitrode UC1526 pulse width modulators it is necessary to keep the pulse width modulator signals off until the input voltage power supply voltage source voltage reaches 4.4 volts. This control is provided by the under voltage lockout circuit which maintains the $\overline{\text{RESET}}$ voltage at a sufficiently low voltage level until a power supply voltage source voltage of approximately 4.4 volts is reached.

In operation, voltage reference generator 21 may comprise a 1.2 volt band gap reference which provides a fixed positive voltage to the negative terminal of comparator 24, and the voltage dividing resistors R1 and R2 provide a voltage dependent on power supply voltage source voltage to the positive terminal of comparator 24. When power supply voltage source voltage is greater than 4.2 volts, the comparator output remains at high voltage and its inverted output is at low voltage. This in turn holds the base of transistor Q27 in a low voltage state which keeps transistor Q27 turned off, thereby maintaining a high voltage at $\overline{\text{RESET}}$ terminal 26. When the power supply voltage source voltage drops below 4.2 volts, the comparator output switches to a low voltage level, and its inverted output switches to a high voltage level, thereby providing a low voltage level at the $\overline{\text{RESET}}$ ($V_a$, FIG. 4) terminal 26.

The LinFinity 1526/B has a flat $\overline{\text{RESET}}$ characteristic under voltage lock out circuit as shown in FIG. 4. The flat characteristic is seen as the constant low $\overline{\text{RESET}}$ voltage which does not change between 0 volts and the point which $\overline{\text{RESET}}$ goes to its high voltage level where $\overline{\text{RESET}}$ becomes equal to the power supply voltage. In contrast, the Unitrode UC 1526 does not exhibit the flat $\overline{\text{RESET}}$ characteristic.

Figure 6:
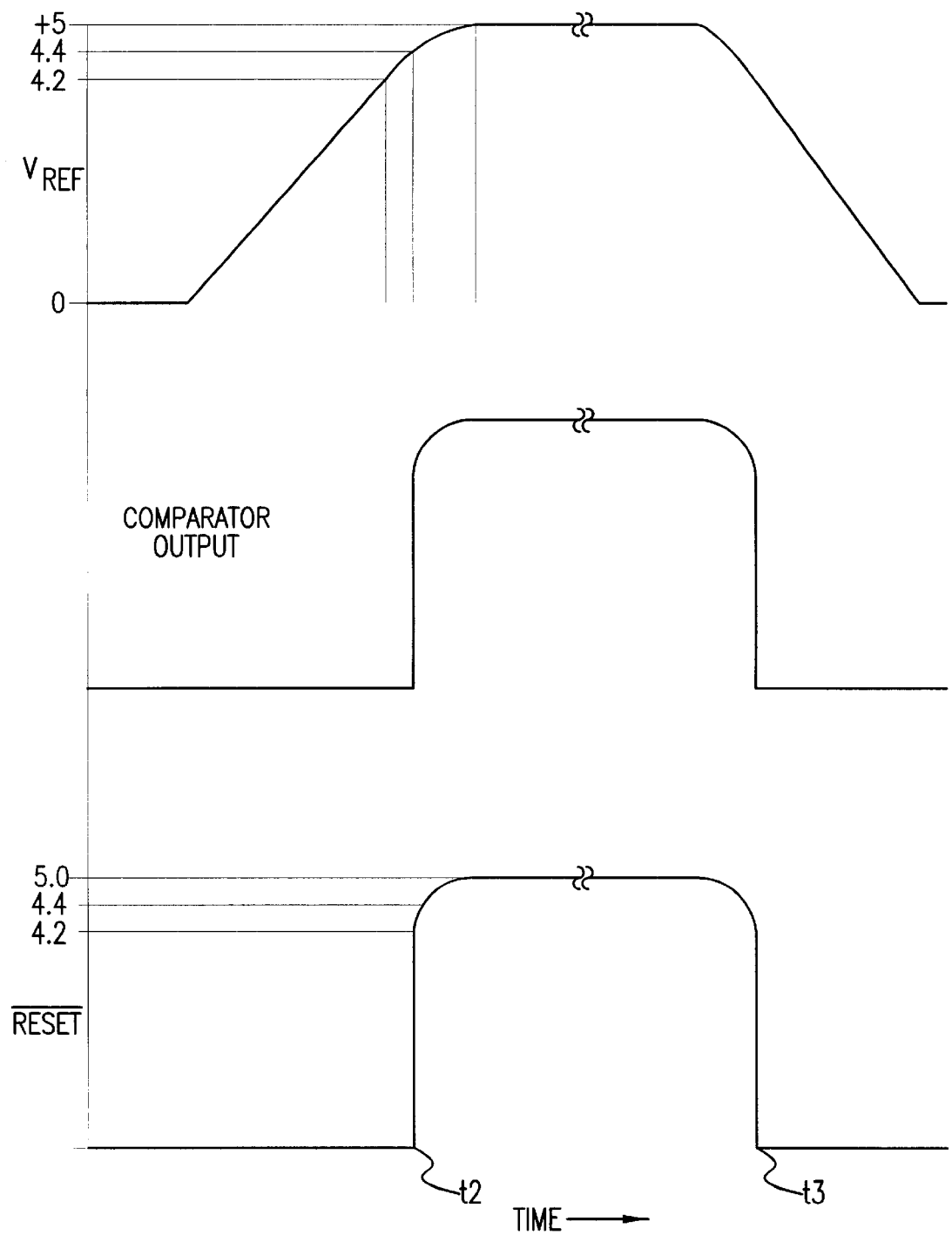
FIG. 6 shows a timing diagram of the components of FIG. 3, which has been made utilizing the flat $\overline{\text{RESET}}$ characteristic under voltage lockout curve set forth in FIG. 4.

The timing diagram, FIG. 6, shows the relationship of the voltage power supply voltage source voltage to the comparator output voltage before inversion and the $\overline{\text{RESET}}$ voltage on terminal 26 of the LinFinity 1526/B which has the flat $\overline{\text{RESET}}$ characteristic under voltage lock out circuit. It should be noted that FIG. 6 utilizes the relationship shown in FIG. 4.

The regulating pulse width modulator manufactured by Unitrode (Unitrode UC 1526 ), the under voltage lockout circuit, soft start circuit, and digital control port schematic circuits as shown in the specification sheets are depicted to be the same as the LinFinity specification sheet circuits. However, in Unitrode the power supply voltage source voltage, $\overline{\text{RESET}}$ voltage curve (FIG. 5) is different from the LinFinity power supply voltage source voltage, $\overline{\text{RESET}}$ curve shown in FIG. 4. In the Unitrode device, the $\overline{\text{RESET}}$ voltage at low levels of the reference voltage rises to a height of approximately 1.5 volts before being reduced to a low level when the transistor Q27 turns on. In comparison, FIG. 4 shows the reference voltage $\overline{\text{RESET}}$ characteristic of the LinFinity SG1526/B where, at reference voltages less than 2 volts, the RESET voltage remains low without the increase present in the Unitrode device (FIG. 5). This flat $\overline{\text{RESET}}$ characteristic under voltage lockout is a useful feature of the SG1526/B. Applicant has tested the LinFinity SG1526/B to verify that the flat $\overline{\text{RESET}}$ characteristic under voltage lockout relationship shown in FIG. 4 is indeed correct, especially at low voltages. The Unitrode device does not produce the flat $\overline{\text{RESET}}$ characteristic under voltage lockout like that shown in FIG. 4. It is believed that the Unitrode voltage characteristic shown in FIG. 5 with the rise to 1.5 volts before the transistor 27 turns on, is produced by "floating voltage" within the circuit which is produced when the power supply voltage source voltage is insufficient to adequately energize the TTL logic and turn transistor 27 on. When transistor 27 turns on, the RESET voltage output is held at the low voltage level shown in FIG. 5. However, in the SG1526/B, this 1.5 volt characteristic of a floating voltage is not present. The flat $\overline{\text{RESET}}$ characteristic under voltage lockout in the LinFinity SG1526V is advantageous in the application of this integrated circuit as an under voltage lock out $\overline{\text{RESET}}$ circuit for a EEPROM when used in space. The reason is that the $\overline{\text{RESET}}$ voltage should be maintained as low as possible in order to prevent any cross data reading or writing from the EEPROM prior to power supply voltage source voltage having obtained a value sufficient to properly drive the EEPROM.

FIG. 3 does not show logic which would provide for the flat $\overline{\text{RESET}}$ characteristic under voltage lockout of the curve shown in FIG. 4 at voltages less than 2 volts for power supply voltage source voltage. It is believed that this logic is proprietary data known to LinFinity. However, since one of ordinary skill in the art can easily purchase a LinFinity SG1526/B regulating pulse width modulator integrated circuit off of the open market at the time of filing of this application, there is no problem in implementing this invention as it relates to use of the flat $\overline{\text{RESET}}$ characteristic under voltage lockout to control the $\overline{\text{RESET}}$ voltage applied to the $\overline{\text{RESET}}$ terminal of a EEPROM located on a satellite.

The Unitrode SG1526regulating pulse width modulator is also available on the open market and its under voltage lockout circuit can be substituted for that in the LinFinity 1526/B regulating pulse width modulator under voltage to form the circuit shown in FIG. 3, but without the flat $\overline{\text{RESET}}$ characteristic under voltage lockout.

FIG. 5 shows that at low power supply voltages, the RESET voltage rises and becomes equal to the power supply voltage. This increase in $\overline{\text{RESET}}$ voltage seen in the Unitrode UC 1526 may cause undesirable erasing and programming when the power supply voltage source voltage is at low levels. This may be a problem when the embodiment incorporating the Unitrode UC 1526 integrated circuit is used in a location where reprogramming of a EEPROM is not possible.

When a programming error occurs at ground level , it will be significant, but not catastrophic because the computer being located on earth can be attended to and the EEPROM can be reprogrammed. However, when the computer, the EEPROM, and the under voltage lockout $\overline{\text{RESET}}$ circuit are located in space, it is always of concern to have the EEPROM subjected to any increase in the under voltage lockout $\overline{\text{RESET}}$ voltage above the lowest level at any time when the power supply voltage source voltage is less than the voltage where transistor Q27 is turned on and off. In FIG. 6, transistor Q27 turns on at time $T_2$ and of at time $T_3$.

What is claimed is:

1. A method for protecting a EEPROM when power supply voltage source voltage drops below a predetermined level comprising the steps of;
   connecting a $\overline{\text{RESET}}$ terminal of the EEPROM to an under voltage lockout circuit $\overline{\text{RESET}}$ terminal;
   providing a reference voltage;
   comparing the power supply voltage source voltage to the reference voltage;
   switching a comparator output when the power supply voltage source voltage drops to the predetermined value;
   switching an under voltage lockout $\overline{\text{RESET}}$ voltage to a value which prevents reading or reprogramming of said EEPROM when said power supply voltage source voltage is below the predetermined level; and
   holding said under voltage lockout $\overline{\text{RESET}}$ voltage at a constant value from when power supply voltage source voltage equals 0 to the point where said step of switching of the comparator output occurs.

2. A method in accordance with claim 1, further comprising the step of providing a hysteresis characteristic in said step of comparing.

3. The method in accordance with claim 1 further comprising the step of providing a flat $\overline{\text{RESET}}$ characteristic under voltage lockout circuit for the steps of comparing, switching the comparator, switching the under voltage lockout $\overline{\text{RESET}}$ voltage and holding.

4. A method for protecting a EEPROM from false programming or reading caused by reduced power supply voltage source voltage comprising the steps of:

connecting a $\overline{\text{RESET}}$ terminal of the EEPROM to a $\overline{\text{RESET}}$ voltage terminal of a flat $\overline{\text{RESET}}$ characteristic under voltage lockout; and connecting the power supply voltage source voltage to a first power supply input terminal of the flat $\overline{\text{RESET}}$ characteristic under voltage lockout.

5. The method in accordance with claim 4, wherein said EEPROM and flat $\overline{\text{RESET}}$ characteristic under voltage lockout are placed in space.

6. The method in accordance with claim 1, wherein said EEPROM and flat $\overline{\text{RESET}}$ characteristic under voltage lockout are placed in space.

7. A method in accordance with claim 1, wherein said step of comparing comprises:

connecting the power supply voltage source to a voltage divider, and comparing a band gap reference voltage to a voltage from said voltage divider.

8. A method for protecting a EEPROM from false programming or reading caused by reduced power supply voltage source comprising the steps of:

connecting the power supply source to a regulating pulse width modulator chip under voltage lockout; and connecting a $\overline{\text{RESET}}$ terminal of the under voltage lockout to a $\overline{\text{RESET}}$ terminal of the EEPROM.

9. A method in accordance with claim 8 wherein the under voltage lockout has a flat $\overline{\text{RESET}}$ characteristic.

* * * * *

UNITED STATES PATENT AND TRADEMARK OFFICE
CERTIFICATE OF CORRECTION

PATENT NO.      : 6,418,056 B1
DATED           : July 9, 2002
INVENTOR(S)     : Scott C. Willis and Mark J. Jones It is certified that error appears in the above-identified patent and that said Letters Patent is hereby corrected as shown below:

<u>Title page,</u>
Item [73], Assignee, after "BAE SYSTEMS" insert -- Information and Electronic Systems Integration --

Signed and Sealed this

Thirteenth Day of May, 2003

JAMES E. ROGAN
*Director of the United States Patent and Trademark Office*